United States Patent [19]

Yamamoto et al.

[11] Patent Number: 5,209,873
[45] Date of Patent: May 11, 1993

[54] ELECTRICALLY CONDUCTIVE PASTE AND COATING

[75] Inventors: Yuzo Yamamoto, Wakayama; Hiromoto Mizushima, Saitama; Yumi Rakue, Wakayama, all of Japan

[73] Assignee: Kao Corporation, Tokyo, Japan

[21] Appl. No.: 709,153

[22] Filed: Jun. 3, 1991

[30] Foreign Application Priority Data

Jul. 6, 1990 [JP] Japan ................... 2-178682

[51] Int. Cl.$^5$ ............................. H01B 1/00
[52] U.S. Cl. ................... 252/512; 156/901; 428/688; 428/901; 568/716; 568/731; 568/763; 568/780
[58] Field of Search ........... 252/500, 512; 568/716, 568/731, 763, 780; 428/688, 901; 156/901

[56] References Cited

U.S. PATENT DOCUMENTS 4,559,166 12/1985 Morinaga et al. ............... 252/500

FOREIGN PATENT DOCUMENTS 2411933 9/1974 Fed. Rep. of Germany .
55-29276 2/1980 Japan .
63-15497 1/1988 Japan .

Primary Examiner—Mark L. Bell
Assistant Examiner—Anthony J. Green
Attorney, Agent, or Firm—Birch, Stewart, Kolasch & Birch

[57] ABSTRACT

An electrically conductive paste composition comprises an electrically conductive powder, a solvent and an organic binder comprising one or more monohydric phenol adduct compound selected from the group consisting of:

(a) a monohydric phenol adduct of an unsaturated fatty acid, its metal salt or an unsaturated fatty acid ester,
(b) a saturated or unsaturated fatty acid ester of said phenol adduct (a),
(c) a sulfonation product of said phenol adduct (a) and
(d) an amination product of said phenol adduct. It is applied to a resin article to provide an electric circuit having an improved adhesion.

7 Claims, No Drawings

ELECTRICALLY CONDUCTIVE PASTE AND COATING

FIELD OF INDUSTRIAL APPLICATION

The present invention relates to a conductive paste comprising a conductive powder and an organic binder, and a conductive coating wherein use is made of the conductive paste. More particularly, it is concerned with a conductive paste which can form a conductive coating having excellent adhesion through application of the conductive paste on a circuit board, such as a paper-phenolic resin board or a glass epoxy resin board, by screen printing or the like, followed by heat curing. The conductive paste is also suitable for use in applications such as a conductor for preventing an electromagnetic wave noise of a circuit board, or as a conductor for wiring of a circuit board, and as a conductive coating produced by applying the conductive paste by coating or printing and curing the paste.

PRIOR ART

In general, a conductive paste basically comprises an organic binder, such as an epoxy resin, a saturated polyester resin, an acrylic resin or a phenolic resin (hereinafter often simply referred to as the "binder"), a conductive powder and a solvent.

The conductive paste has hitherto been used as a conductor for a circuit board. In recent years, an attempt has been made to the use the conductive paste as an electromagnetic wave shielding material for a printed circuit board. Specifically, in this application, a printed circuit board comprising a board having formed thereon a conductive layer which has a circuit pattern including a formed earth pattern, wherein a ground pattern portion of the surface of the board having a conductive layer formed thereon is removed, an insulating layer is printed on the surface of the board so as to cover the conductive layer and a conductive paste is then printed so as to cover the insulating layer and connect with the ground pattern, thereby forming an electromagnetic wave shielding layer for use as a conductor of a circuit board for preventing an electromagnetic wave noise (see Japanese Patent Laid-Open No. 15497/1988 and Japanese Utility Model Laid-Open No. 29276/1980).

Attention has been paid to conductive pastes, particularly a conductive copper paste as a conductor alternative to an expensive conductive silver paste. However, the conductive copper paste has a serious in that it has a poor adhesion to the surface of copper foil. In particular, it is poor in the adhesion to the surface of a metallic copper deprived from an oxide film present on the surface thereof by acid etching or the like (although strictly speaking the surface still has an oxide film having a thickness of several tens of angstroms formed through the contact of the surface with air), which makes it necessary to perform a special surface treatment, so that a serious practical problem remains unsolved.

SUMMARY OF THE INVENTION

An electrically conductive paste composition of the invention comprises an electrically co powder, a solvent and an organic binder comprising one or more monohydric phenol adduct compound selected from the group consisting of:

(a) a monohydric phenol adduct of an unsaturated fatty acid, its metal salt or an unsaturated fatty acid ester, (b) a saturated or unsaturated fatty acid ester of said phenol adduct (a), (c) a sulfonation product of said phenol adduct (a) and (d) an amination product of said phenol adduct a. It is applied to a re in article to provide an electric circuit having an improved adhesion.

The composition may comprise an electrically conductive powder, a solvent, an conventional organic binder and in addition an organic binder component of one or more monohydric phenol adduct compounds.

It is preferable that the monohydric phenol adduct compound be one defined the formula (I) shown below.

The composition may comprise 50 to 95 percent by weight, based on the entire composition except for the solvent, of an electrically conductive powder selected from a metal powder and a solid powder coated with a metal, a solvent, 5 to 50 percent by weight, based on the entire composition except for the solvent, of (B) a thermoplastic resin for the organic binder and in addition (A) an organic binder component of one or more monohydric phenol adduct compound at a weight ratio of (A) to (B) in the range between 0.1/99.9 and 99.9/0.1.

The composition may further comprise a fatty acid, a fatty acid metal salt, a higher aliphatic amine and/or a reducing agent.

The invention provides an electric article containing a printed electric circuit which comprises a base and the paste composition cured on the base.

Particularly preferred examples of the monohydric phenol addition compound used in the present invention include those represented by the following general formula (I), such as phenol linoleate and phenol ricinoleate:

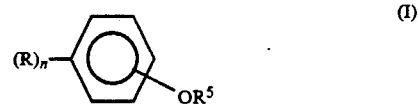
(I)

wherein R is a residue of an unsaturated fatty acid or its ester bonded to the phenol at the o or p-position and represented by the formula $R^1COOR^2$— or $R^3OCOR^4$—wherein $R^1$ is a monovalent unsaturated hydrocarbon group having 15 to 21 carbon atoms, $R^2$ is a hydroxyalkylene group having at least one carbon atom, an arylene group or a branched or straight chain alkylene group, $R^3$ is a hydrogen atom, a hydroxyalkyl group having at least one carbon atom, an alyl group or a branched or straight chain alkyl group and $R^4$ is a divalent unsaturated hydrocarbon group having 15 to 21 carbon atoms; $R^5$ is hydrogen, an alkali metal, an alkaline earth metal, or a fatty acid residue having 1 to 21 carbon atoms; and n is an integer of 1, 2 or 3.

In the present invention, examples of the fatty acid advantageously usable in the synthesis of the monohydric phenol addition compound include unsaturated fatty acids such as palmitoleic, oleic, elaidic, linoleic, linolenic, vaccenic, arachidonic, α-eleostearic tariric, ricinoleic and erucic acids. Further, it is also suitable to use mono-, di- and triesters or polyesters of these unsaturated fatty acids with the following various alcohols. Examples of the alcohols include straight chain and branched monohydric alcohols such as methanol, ethanol, propanol, octyl alcohol, dodecyl alcohol, stearyl alcohol, oleyl alcohol and isostearyl alcohol, polyhydric alcohols such as ethylene glycol, propylene glycol, butanediol, hexanediol, nonanediol, glycerin and sorbitol, and aromatic monohydric alcohols such as benzyl alcohol, phenol, octylphenol and nonylphenol. Further, it is also possible to use tung oil and safflower oil containing the above described unsaturated fatty acid esters, and the like. The alkali metal includes sodium, potassium and lithium and the alkaline earth metal includes calcium, magnesium and barium.

A great feature of the monohydric phenol addition compound of the present invention resides in that the benzene ring has one OH group (or a group derived therefrom). Any improvement in the adhesion intended in the present invention cannot be attained in the case of alkylbenzene derivatives wherein the number of OH groups is increased to 2, 3 or the like, such as alkylcatechol and alkylpyrogallol. Although the reasons for this are not necessarily clear, one of the reasons is believed to reside in that these compounds are chemically and thermally unstable.

It is preferred to use the organic binder of the conductive paste of the present invention in combination with a thermosetting resin.

Examples of the thermosetting resin useful in the present invention include known thermosetting resins such as phenolic, urea, amino, alkyd, silicon furan, unsaturated polyester, epoxy, polyurethane, polyester-polyol and acrylic resins. Phenolic and amino resins are particularly preferred.

Examples of the phenolic resin include a resin prepared by conducting condensation of a compound having a phenolic hydroxyl group, such as phenol, cresol, xylenol, p-alkylphenol, chlorophenol, bisphenol A, phenolsulfonic acid or resorcinol, with an aldehyde, such as formalin or furfural. A resol type phenolic resin is particularly preferred. When a novolak type phenolic resin is used, it is preferred to use the resin in combination with hexamethylenetetramine.

The binder component particularly useful in the present invention is a polyhydroxystyrene derivative having a weight average molecular weight of 1,000 to 2,000,000 and a hydroxystyrene copolymer and/or its derivative. The addition of these binder components facilitates the formation of a coating having a sufficiently high conductivity even when the curing is conducted at a high speed.

The polyhydroxystyrene derivative and hydroxystyrene copolymer and/or its derivative are represented by the following general formula (II):

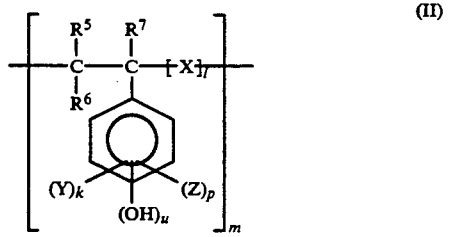

(II)

wherein $l \geq 0$ and $m \geq 3$, provided that the weight average molecular weight of the organic polymer represented by the formula (II) is up to 2,000,000;
$0 \leq k \leq 2$, $0 \leq p \leq 2$ and $0 \leq u \leq 2$, provided that $k+p+u>0$;

$R^5$ to $R^7$ are each hydrogen or an alkyl group having 1 to 5 carbon atoms;
X is a polymerizable vinyl monomer; and
Y and Z which may be the same or different from each other are selected from:

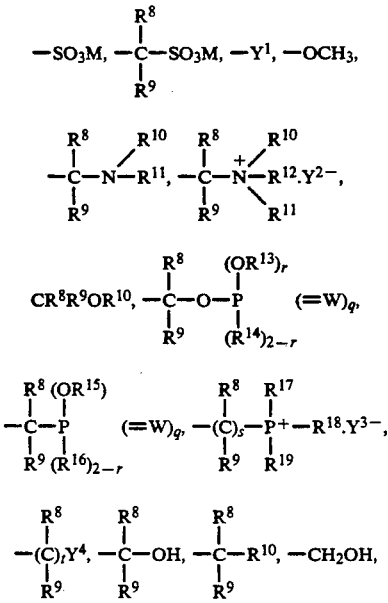

an alkyl group having 1 to 18 carbon atoms, or an aryl group,
wherein M is hydrogen, an alkali metal, an alkaline earth metal or an organic cation such as amine, $Y^1$ and $Y^4$ are each a halogen, $Y^2-$ to $Y^3-$ are each a counter ion such as a halide ion, an organic acid anion or an inorganic acid anion, W is sulfur or oxygen, $R^8$ to $R^{12}$ which may be the same or different from each other are a straight-chain or branched alkyl group or an alkyl group derivative, such as a hydroxyalkyl group, an aromatic group or hydrogen, $R^8$ and $R^{11}$ may be combined with nitrogen to form a ring, $R^{11}$ to $R^{19}$ which may be the same or different from each other are a straight-chain or branched alkyl group or an alkyl group derivative, such as a hydroxyalkyl group, an aromatic group or hydrogen, q, s and t are each 0 or 1, and r is 0, 1 or 2.

The amino resin used as the thermosetting resin is preferably one having a weight average-molecular weight of 500 to 50,000. Examples thereof include resins prepared by condensing an amino group of urea, melamine, guanamine, aniline or sulfonamide with formalin, and epoxy modified melamine resins, phenol modified melamine resins, acryl modified melamine resins, butylated urea resins, butylated urea melamine co-condensed resins, butylated melamine guanamine co-condensed resins, amino-alkyd co condensed resins and alkyl-etherified melamine resins. Alkyl etherified melamine resins are preferred.

Examples of the alkyl etherified melamine resin include methylmelamine resins such as Superbeckamine L- 105-60, n-butylated melamine resins such as Superbeckamine J-820-60, J-840, L-117-60, L 127-60 and L-109 50, and isobutylated melamine resin such as Superbeckamine G-821-60, L-118-60, L-121-60, TD 139-50, L-110-60, L-125-60, 47- 508 -60, L 145-60 and L-116-70 all of which are trade names of products manufactured by Dainippon Ink and Chemicals, Inc.; and n-butylated melamine resins such as Uvan 20SB, 20SE-60, 20HS, 21R, 22R, 120, 122, 128, 220 and 225 and isobutylated melamine resins such as Uvan 60R, 62, 69-1, 164 and 165 all of which are trade names of products manufactured by Mitsui Toatsu Chemicals, Inc. In the above described alkyl-etherified melamine resins, the weight-average molecular weight ($\overline{Mw}$) and the degree of etherification (when the degree of etherification is 100%, six alkyl ether groups are introduced per unit of a triazine ring) are desirably 500 to 50,000 and 10 to 95%, respectively, more desirably 1,000 to 25,000 and 20 to 80%, respectively, and most desirably 1,000 to 10,000 and 30 to 60%, respectively. When the $\overline{Mw}$ value is less than 500, the flexibility of the cured coating is insufficient, while when it exceeds 50,000, the adhesion and conductivity become poor. When the degree of etherification is less than 10%, the melamine is unstable, so that the pot life of the conductive paste becomes short. On the other hand, when it exceeds 95%, the curing speed lowers, which makes it impossible to form a sufficiently dense coating under ordinary curing conditions, so that it becomes difficult to obtain a sufficient adhesion and conductivity.

Examples of the epoxy-modified melamine include Uvan 80S. Examples of the acryl-modified melamine resins include Dianal HR series manufactured by Mitsubishi Rayon Co., Ltd. Examples of the butylated urea resin include Uvan 105-60 and 10R. Examples of the butylated urea melamine co condensed resin include Uvan 134, 135 and 136, and Beckamine OD L-131-60 and L-806-60. Examples of the amino-alkyd co-condensed resin include Beckosol M-7600, M 7600-M, 47 623, M-7606-55-MV, M-7606-55-HV, M 7608-55, M -7611 55, M 7615-60, M 7630-80, M-7631-80 and M 7652-55 manufactured by Dainippon Ink and Chemicals, Inc.

It is further preferred to use the above-described amino resin in combination with the above-described polyhydroxystyrene derivative. The use of known acid or alkaline catalysts is very useful for the curing reaction and enables a conductive coating having excellent durability and adhesion to be formed. An acid catalyst is preferred, and mineral acids such as hydrochloric and phosphoric acids, organic fatty acids such as linoleic and oleic acids and organic acids such as oxalic, tartaric and p-toluenesulfonic acids may be used.

A diepoxide of a bisphenol is preferred as the epoxy resin used as the thermosetting resin, and examples thereof include Epikote 827, 828, 834, 1001, 1002, 1004, 1007 and 1009 manufactured by Shell Chemicals, DER 330, 331, 332, 334, 335, 336, 337, 660, 661, 662, 667, 663 and 669 manufactured by Dow Chemical Co., Araldite GY 250, 260, 280, 6071, 6084, 6097 and 6099 manufactured by Ciba-Geigy Ltd., EPI RE 2510 and 5101 manufactured by Jones Dabney Inc., Epiclon 810, 1000, 1010 and 3010 manufactured by Dainippon Ink and Chemicals, Inc. (all of which are traded names), and EP series manufactured by Asahi Denka Kogyo Co., Ltd. Further, the epoxy resin may be one having an average number of epoxy groups of 3 or more, e.g., a novolak-epoxy resin. The novolak-epoxy resin preferably has a molecular weight of 500 or more. Examples of the novolak-epoxy resin of this kind manufactured on a commercial scale include Araldite EPN 1138 and 1139, ECN 1273, 1280 and 1299 manufactured by Ciba Geigy Ltd., DEN 431 and 438 manufactured by Dow Chemical Co., Epikote 152 and 154 manufactured by Shell Chemicals, ERR-0100, ERRB 0447 and ERLB 0488 manufactured by Union Carbide Corp. and EOC series manufactured by Nippon Kayaku Kabushiki Kaisha. If necessary, it is possible to use a curing catalyst and a diluent for an epoxy resin. Examples of the curing catalyst for an epoxy resin include aliphatic amines, aromatic amines and acid anhydrides. Examples of the diluent for an epoxy resin include reactive diluents such as n-butyl glycidyl ether, nonreactive diluents such as dibutyl phthalate, and semi-reactive diluents such as polyglycol.

The above described thermosetting resins used in the present invention may be used alone or in the form of a mixture of two or more of them.

In the present invention, the proportion of the binder component in the conductive paste of the present invention is 5 to 50% by weight, preferably 5 to 40% by weight based on the total weight exclusive of the weight of the solvent. When the proportion is less than 5 parts by weight, the absolute amount of the binder becomes insufficient, which causes the adhesion to be lowered and the flowability of the resultant composition to become poor. Consequently, the printability is lowered and the conductive powder is apt to be oxidized during the thermosetting, which brings about a lowering in the flexibility and conductivity. On the other hand, when the amount of the binder exceeds 50% by weight, the absolute amount of the conductive powder becomes insufficient, which makes it impossible to attain a conductivity necessary for forming a circuit.

The blending weight ratio (A/B) of the monohydric phenol addition compound (A) to the thermosetting resin (B) is 0.1/99.9 to 99.9/0.1, preferably 0.5/99.5 to 90/10.

Examples of the conductive powder used in the present invention include metallic powders, such as copper, silver, nickel and aluminum powders, and powders having a coating layer of the metal on the surface thereof. Copper powder is particularly preferred. Although the conductive powder may be in any of dendritic, flaky, spherical and amorphous forms, an electrolytic copper powder or a spherical powder is preferred. The mean particle diameter is preferably 30 μm or less, and a dendritic powder having a mean particle diameter of 1 to 10 μm is still preferred from the viewpoint of high density and multi-contact filling. The term "mean particle diameter" used herein is intended to mean a median diameter on a volume basis determined by "Model LA-500 Laser Diffraction Particle Size Distribution Measuring Apparatus" manufactured by Horiba, Ltd. When the mean particle diameter exceeds 30 μm, it becomes difficult to conduct high-density filling of the conductive powder, which brings about lowering in the conductivity and deterioration of the printing property. The use of a copper powder subjected to a surface treatment facilitates the attainment of very excellent conductivity, adhesion and flexibility. In the copper paste and coating of the present invention, since there is no need of depositing a solder thereon, an organic surface treatment may be used. The above-described conductive powders may be used alone or in the form of a mixture thereof. It is preferred that the above described metallic powder be of a high purity. In particular, for copper powder, it is most desirable that the purity thereof be identical with the purity of a copper foil or a copper plating layer used in a conductor of a circuit board.

The function and effect of the monohydric phenol addition compound of the present invention is more significantly exhibited when the metallic copper powder is used, which renders the present invention important particularly for the production of a conductive copper paste.

The amount of blending of the conductive powder is desirably 50 to 95% by weight, more desirably 70 to 90% by weight, most desirably 80 to 90% by weight based on the total weight exclusive of the weight of the solvent. When the amount of blending is less than 50% by weight, no sufficient conductivity is attained. On the other hand, when the amount of blending exceeds 95% by weight, the conductive powder cannot sufficiently be bound and the formed coating becomes fragile, so that not only the moisture resistance lowers but also the conductivity deteriorates.

At least one additive selected from among saturated and unsaturated fatty acids and their metal salts and higher aliphatic amines may be incorporated in the conductive paste of the present invention for the purpose of preventing the oxidation of the conductive powder or imparting dispersibility to the conductive powder. Preferred examples of the saturated fatty acid include palmitic, stearic and arachic acids, and preferred examples of the unsaturated fatty acid include oleic and linoleic acids. Examples of their metal salts include sodium and potassium salts. It is also possible to use vegetable oils containing 60% or more of an unsaturated fatty acid, such as soybean oil, sesame oil, olive oil or safflower oil.

The amount of addition of the saturated or unsaturated fatty acid or its salt is desirably 0.1 to 20 parts by weight, more desirably 0.5 to 10 parts by weight in terms of the total of the additives based on 100 parts by weight of the conductive powder. When the amount is less than 0.1 part by weight, no significant effect can be attained by the addition, while when the amount exceeds 20 parts by weight, not only no improvement in the dispersibility corresponding to the amount of addition can be attained but also the conductivity and durability of the formed coating are unfavorably lowered.

The higher aliphatic amine used in the present invention may be any organic compound having an amino group, and it may have other substituents. For example, it may be an α-olefin derived amine having a hydroxyl group. However, since it should be used in combination with the conductive powder, e.g., a solid insoluble in a solvent cannot be used. A higher aliphatic amine having 8 to 22 carbon atoms is preferred. Examples of the higher aliphatic amine include saturated amines such as stearylamine, palmitylamine, behenylamine, cetylamine, octylamine, decylamine and laurylamine, unsaturated monoamines such as oleylamine, and diamines such as stearylpropylenediamine and oleylpropylenediamine.

In the present invention, it is preferred to use the higher aliphatic amines in a total amount of 0.1 to 10 parts by weight based on 100 parts by weight of the conductive powder.

In the conductive paste of the present invention, at least one known reducing agent may be optionally used for the purpose of preventing oxidation of the conductive powder. Preferred examples of the reducing agent include inorganic reducing agents such as phosphorous and hypophosphorous acids and organic and inorganic compounds such as hydroquinone, catechols, ascorbic compounds, hydrazine compounds, formalin, borohydride compounds and reducing sugars.

In the present invention, when the reducing agent is used, the amount thereof is generally preferably 0.1 to 20 parts by weight, still preferably 0.5 to 10 parts by weight based on 100 parts by weight of the conductive powder.

The conductive paste of the present invention is prepared, e.g., by first dissolving a monohydric phenol addition compound in a solvent, adding a thermosetting resin and a conductive powder to the resultant solution, and sufficiently kneading the mixture by means of a disperser, a ball mill, a three-roll mill or the like to prepare a conductive paste.

Examples of the solvent which may be used herein include known solvents such as benzene, toluene, hexanone, butyl carbitol, butyl carbitol acetate, butyl cellosolve, butyl cellosolve acetate, methyl isobuty ketone, methyl amyl ketone, and ethylenic and propylenic glycol ethers such as propylene glycol monomethyl ether acetate and ethyl ethoxypropionate, and dibasic acid diesters such as dimethyl adipate, dimethyl glutarate and dimethyl succinate.

The amount of blending of the solvent varies depending upon the kind of kneader, kneading conditions and kind of solvent. It is preferred to regulate the amount of the solvent in such a manner that the paste after kneading has a viscosity falling within a range sufficient to conduct screen printing.

A circuit board for preventing the occurrence of an electromagnetic wave noise, which comprises a circuit board and an electromagnetic wave shielding layer provided thereon, can be prepared through the use of the conductive paste of the present invention, e.g., as follows. Specifically, a heat curable or ultraviolet-curable organic insulator was applied to a conductive circuit formed from a metal-clad laminate by the etched foil method except for ground pattern portion, thereby providing an insulating layer. The conductive paste of the present invention is applied on substantially the whole surface of the insulating layer by screen printing in such a manner that the paste is connected to the ground pattern. The resultant coating is then heat-cured to prepare a circuit board having an effective electromagnetic wave shielding layer for preventing an electromagnetic wave noise. This circuit board can be effectively utilized also as an electrostatic shielding layer.

Further, the conductive paste of the present invention may be used as a wiring conductor of a circuit board by the same method as that used in the art. The insulating board to which the paste is applied may be any of glass epoxy resin, paper-phenolic resin, ceramic, polycarbonate resin, polyethylene terephthalate resin, polyimide resin, polyolefin resin, vinyl chloride resin, polyester resin, ABS resin, polymethyl methacrylate resin, melamine resin, phenolic resin, epoxy resin and glass substrates. The wiring may be formed by screen printing, intaglio printing, spraying, brushing, etc.

The term "conductive coating" used in the present invention is intended to mean a cured material or a cured coating having a volume specific resistance of $1 \times 10^{-2} \Omega \cdot cm$ or less prepared by drying and curing the conductive paste of the present invention.

As described above, a significant feature of the conductive paste of the present invention resides in the use of a monohydric phenol addition compound having the above-described specific chemical structure as a binder component. According to the present invention, the adhesion to the surface of a copper foil can be remarkably improved through the control of a reaction with the surface of a metal.

Therefore, for example, the use of the conductive copper paste according to the present invention enables overcoming the problem associated such the adhesion, which has been regarded as a serious drawback to the conventional paste. Further, since no severe production control is required, an improvement can be attained. The utilization of the novel copper paste enables an electromagnetic wave shielding layer having a very high reliability and a significant effect to be easily and stably formed on a circuit board. Similarly, a wiring having a high reliability can also be formed when the paste is used as a wiring conductor of a circuit board. Further, the paste can also be effectively utilized in the electrodes of electronic equipment components and circuit components. The above described effects render the present invention very useful from the viewpoint of industry.

EXAMPLES

The present invention will now be described in more detail by way of the following Examples and Comparative Examples, though it is not limited to these Examples only. In the Examples and Comparative Examples, "parts" means "parts by weight".

EXAMPLES

Preparation and printing of paste

Each conductive powder listed in Table 1, each monohydric phenol addition compound listed in Table 2, except sample 14 each thermosetting resin listed in Table 3 and each additive listed in Table 4 were sufficiently kneaded by means of a disperser or a three-roll mill so as to give each composition listed in Table 5, thereby preparing conductive pastes. A pattern having a width of 1 mm and a total length of 7 cm was printed on a glass epoxy resin board (CEM-3 board) through the use of the resultant conductive pastes by means of a screen printing machine provided with a 180-to 250-mesh Tetoron screen. Then, the pattern was heat-cured at 140° to 160° C. for 10 to 30 min to prepare a 20-to 30-μm thick cured film of the paste.

Various characteristics were examined on the conductive circuit prepared by the above-described process. The results are given in Table 5.

Measurement of conductivity

The conductivity of the coating is expressed as a volume specific resistance of the heat cured coating by the two terminal method through the use of a digital multimeter (R6551; manufactured by Advantest).

The volume specific resistance was calculated by making use of the following equation (1):

$$\text{volume specific resistance } (\Omega \cdot cm) = \frac{R \times t \times W}{L} \quad (1)$$

wherein R is the resistance value between electrodes ($\Omega$);
t is the thickness of the coating (cm);
W is the width of the coating (cm); and
L is the distance between electrodes (cm).

Moisture resistance test

The moisture resistance of the coating was determined by allowing a sample to stand for 500 hr under environmental conditions of a temperature of 60° C. and a relative humidity of 95% and determining the percentage change ($W_R$) of the resistance before and after standing.

$$\text{Percentage change of resistance, } W_R, (\%) = \frac{R_{500} - R_0}{R_0} \quad (2)$$

wherein
$R_0$ is the resistance value of the coating before the test ($\Omega$); and
$R_{500}$ is the resistance value of the coating after the 500-hr test ($\Omega$).

The moisture resistance of the coating is expressed based on the $W_R$ value according to the following criterion:
A: a $W_R$ value of less than 10%,
B: a $W_R$ value of 10% or more to less than 30%,
C: a $W_R$ value of 30% or more to less than 100%,
D a $W_R$ value of 100% or more.

Adhesion test

The adhesion of the coating was evaluated by printing the conductive paste of the present invention on a copper foil and an organic insulating layer (S-222 MR-12 manufactured by Taiyo Ink Mfg. Co., Ltd.) by screen printing so as to give a coating thickness of 20 to 30 μm, baking the paste, bonding a stainless steel square pillar having an area of 1 cm² to the surface of the coating with an adhesive, and conducting a vertical tensile test. Evaluation criterion is as follows.
A: 10 kgf/cm² or more,
B: 10 to 5 kgf/cm²,
C: 5 kgf/cm² or less.

Evaluation of printability

The printability of each conductive paste was evaluated by screen printing through the use of a 180- to 250-mesh Tetoron screen. Evaluation criterion is as follows.
o: excellent printability
Δ: capable of printing in a way,
x: incapable of printing.

Comparative Examples

Conductive pastes respectively having compositions specified in Table 5 were prepared, and a conductor was formed on a board in the same manner as that of the Examples. The coating was subjected to the measurement of the volume specific resistance, and the moisture resistance, heat resistance, printability and adhesion thereof were examined. The results are given in Table 5.

TABLE 1

| Symbol | Kind | Form | Mean (particle diameter (μm) |
|---|---|---|---|
| Cu-7*1 | copper powder | dendritic | 7.5 |
| Cu-10*2 | " | " | 10.2 |
| Ag | silver powder | spherical | 1 |
| Ni | nickel powder | spherical | 3 |

Note:
*1 organometallic surface-treated copper powder
*2 organic surface-treated copper powder

TABLE 2

| No. | monohydric phenol addition compound |
|---|---|
| 1 | phenol adduct of oleic acid |

TABLE 2-continued

| No. | monohydric phenol addition compound |
|---|---|
| 2 | phenol adduct of methyl oleate |
| 3 | phenol adduct of linoleic acid |
| 4 | phenol adduct of methyl linoleate |
| 5 | phenol adduct of ricinoleic acid |
| 6 | phenol adduct of methyl ricinoleate |
| 7 | phenol adduct of tung oil |
| 8 | phenol adduct of safflower oil |
| 9 | phenol adduct of linolenic acid |
| 10 | dimethylamination product of phenol adduct of linoleic acid |
| 11 | carboxymethylation product of phenol adduct of linoleic acid |
| 12 | catechol oleate control |
| 13 | potassium salt of phenol adduct of oleic acid |
| 14 | potassium salt of phenol adduct of linolenic acid |

TABLE 3

| Symbol | Compound | Weight average molecular weight ($\overline{Mw}$) |
|---|---|---|
| a | isobutylated melamine resin (Superbeckamine G-821-60; a product of Dainippon Ink and Chemicals, Inc.) | — |
| b | n-butylated melamine resin (Uvan 20S, 60; a product of Mitsui Toatsu Chemicals, Inc.) | — |
| c | n-butylated melamine resin (Uvan 225; a product of Mitsui Toatsu Chemicals, Inc.) | — |
| d | resol type phenolic resin (Resitop PL-2211; a product of Gunei Chemical Industry Co., Ltd.) | — |
| e | epibis type epoxy resin plus curing catalyst (Epikote 828; a product of Shell Chemicals) | — |
| f | polyester-polyol resin plus curing catalyst [Burnock D-220; a product of Dainippon Ink and Chemicals, Inc.) | — |
| g | acrylic resin (Almatex E901; a product of Mitsui Toatsu Chemicals, Inc.) | — |
| h | epoxy-modified melamine resin (Uvan 80S; a product of Mitsui Toatsu Chemicals, Inc.) | — |
| i | 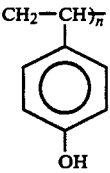 | 10,000 |
| j | 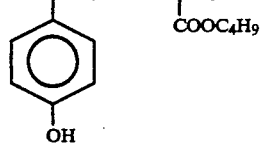 | 5,500 |
| k | 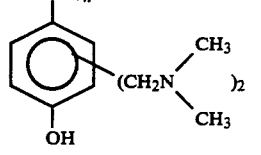 | 4,000 |

TABLE 3-continued
| Symbol | Compound | Weight average molecular weight ($\overline{Mw}$) |
|---|---|---|
| l | 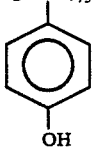 R$_1$, R$_2$: —CH$_3$  R$_3$: —CH$_2$—C(CH$_3$)$_3$ (with CH$_3$ groups shown) | — |
| m | butyral resin (Denka Butyral #5000-A; a product of Denki Kagaku Kogyo K.K. | — |
| n | polyvinyl acetal resin (S-lec ES-5; a product of Sekisui Chemical Co., Ltd.) | — |
TABLE 4
| No. | Other additives |
|---|---|
| 1 | oleic acid |
| 2 | linoleic acid |
| 3 | palmitylamine |
| 4 | hydroquinone |

TABLE 5

| | Conduct paste composition[1] | | | | | | | | | | | Adhesion | | |
|---|---|---|---|---|---|---|---|---|---|---|---|---|---|---|
| | conductive powder | | monohydric phenol addition compd. (A) | binder | | | additive | | Volume specific resistance | Moisture resistance | copper foil | insulating layer | Print-ability |
| No. | symbol | amt. of blending (pts.) | No. | other organic binder (B) symbol | amt. of blending (A + B) (pts.) | $\left(\dfrac{A}{A+B} \times 100\right)$ % | symbol | amt. of blending (pts.) | ($\Omega \cdot$ cm) | | | | |
| Product of present invention | | | | | | | | | | | | | |
| 1 | Cu-7 | 86 | 1 | a | 14 | 30 | — | — | $0.8 \times 10^{-4}$ | A | A | A | o |
| 2 | Cu-7 | " | 2 | b | 12.4 | 30 | 1 | 1.6 | $1.1 \times 10^{-4}$ | " | " | " | o |
| 3 | Cu-7 | " | 3 | a | 13.2 | 30 | 4 | 0.4 | $1.2 \times 10^{-4}$ | " | " | " | o |
| 4 | Cu-7 | " | 4 | a + i(a/i = 70/30) | 13 | 2 | 3 | 1.0 | $0.9 \times 10^{-4}$ | " | " | " | o |
| 5 | Cu-7 | " | 5 | a + i(a/i = 65/35) | 13 | 4 | 1 | 0.5 | $1.0 \times 10^{-4}$ | " | " | " | o |
| 6 | Cu-7 | " | 6 | b + k(b/k = 50/50) | 13 | 2 | 1 | 1.6 | $1.5 \times 10^{-4}$ | " | " | " | o |
| 7 | Cu-7 | " | 7 | c | 14 | 40 | — | — | $2.1 \times 10^{-4}$ | " | " | " | o |
| 8 | Cu-7 | " | 8 | d | 13 | 30 | 3 | 1.0 | $0.8 \times 10^{-4}$ | " | " | " | o |
| 9 | Cu-7 | " | 9 | h | 13.2 | 20 | 4 | 0.8 | $2.2 \times 10^{-4}$ | " | " | " | o |
| 10 | Cu-10 | " | 10 | c + j(c/j = 60/40) | 12.4 | 5 | 2 | 1.6 | $1.1 \times 10^{-4}$ | " | " | " | o |
| 11 | Cu-10 | " | 11 | c + g(c/g = 70/30) | 13 | 2 | 1 | 1.0 | $1.5 \times 10^{-4}$ | " | " | " | o |
| 12 | Cu-10 | 85 | 2 | a + i + m (a:i:m = 65:25:10) | 14.5 | 2 | 2 | 0.5 | $0.9 \times 10^{-4}$ | A | " | " | o |
| 13 | Cu-10 | 86 | 1 | b + j(b/j = 50/50) | 14.5 | 4 | 4 | 0.5 | $1.6 \times 10^{-4}$ | A | A | A | o |
| 14 | Cu-10 | " | 1 | c + l(c/l = 70/30) | 15 | 5 | — | — | $1.0 \times 10^{-4}$ | " | " | " | o |
| 15 | Cu-10 | " | 3 | c + j + m (c:j:m = 65:30:5) | 15 | 2 | — | — | $0.8 \times 10^{-4}$ | " | " | " | o |
| 16 | Cu-10 | " | 3 | c + j + n (c:j:n = 65:30:5) | 14.2 | 0.2 | 4 | 0.8 | $1.8 \times 10^{-4}$ | " | " | " | o |
| 17 | Cu-10 | " | 3 | c | 13.4 | 0.05 | 2 | 1.6 | $2.5 \times 10^{-4}$ | B | " | " | o |
| 18 | Cu-10 | " | 4 | a + k(a/k = 70/30) | 14.6 | 2 | 1 | 1.6 | $1.7 \times 10^{-4}$ | A | " | " | o |
| 19 | Cu-10 | " | 4 | a + e(a/e = 70/30) | 14.2 | 2 | 1 | 0.8 | $2.1 \times 10^{-4}$ | " | " | " | o |
| 20 | Cu-10 | " | 4 | a + f(a/f = 70/30) | 14.2 | 2 | 1 | 0.8 | $2.2 \times 10^{-4}$ | " | " | " | o |
| 21 | Ag | 80 | 1 | c | 19.2 | 30 | 2 | 0.8 | $0.5 \times 10^{-4}$ | " | " | " | o |
| 22 | Ag | 80 | 3 | d | 19.2 | 30 | 2 | 0.8 | $0.7 \times 10^{-4}$ | " | " | " | o |
| 23 | Ni | 80 | 8 | c + i(c/i = 70/30) | 18.4 | 10 | 1 | 1.6 | $3.0 \times 10^{-4}$ | " | " | " | o |
| Comparative Examples | | | | | | | | | | | | | |
| 24 | Ni | 80 | 9 | h | 18.4 | 30 | 2 | 1.6 | $4.2 \times 10^{-4}$ | " | " | " | o |

TABLE 5-continued

| | Conduct paste composition[1] | | | | | | | | | | | | | |
|---|---|---|---|---|---|---|---|---|---|---|---|---|---|---|
| | conductive powder | | monohydric phenol addition compd. (A) | binder | | | additive | | Volume specific resistance | Moisture resistance | Adhesion | | Print-ability |
| No. | symbol | amt. of blending (pts.) | No. | other organic binder (B) symbol | amt. of blending (A + B) (pts.) | $\left(\dfrac{A}{A+B} \times 100\right)$ % | symbol | amt. of blending (pts.) | ($\Omega \cdot$ cm) | | copper foil | insulating layer | |
| 25 | Cu-7 | 85 | — | a | 13.4 | 0 | 1 | 1.6 | — | C | C | B | o |
| 26 | Cu-7 | " | — | b + d(b/d = 70/30) | 13.4 | 0 | 2 | 1.6 | — | " | " | " | o |
| 27 | Cu-7 | " | — | c + g(c/g = 50/50) | 14.2 | 0 | — | — | — | " | " | " | o |
| 28 | Cu-10 | " | — | a + e(a/e = 70/30) | 14.2 | 0 | 1 | 0.8 | — | " | " | " | o |
| 29 | Cu-10 | " | — | a + f(a/f = 70/30) | 14.2 | 0 | 1 | 0.8 | — | " | " | " | o |
| 30 | Cu-10 | " | 12 | b + d(b/d = 70/30) | 14.2 | 30 | 1 | 0.8 | — | " | " | " | o |
| 31 | Ag | 80 | — | c | 14.2 | 0 | 1 | 0.8 | — | " | " | " | o |
| 32 | Ni | 80 | — | h | 13.4 | 0 | 1 | 1.6 | — | " | " | " | o |
| Product of present invention | | | | | | | | | | | | | | |
| 33 | Cu-7 | 82.5 | 13 | d | 16.9 | 10 | 4 | 0.6 | $0.9 \times 10^{-4}$ | A | A | A | o |
| 34 | Cu-7 | 82.5 | 14 | d | 16.9 | 10 | 4 | 0.6 | $1.1 \times 10^{-4}$ | A | A | A | o |

Note: [1]The amt. of blending is expressed in terms of the active ingredient.

We claim:

1. An electrically conductive paste composition which comprises 50 to 95 percent by weight of an electrically conductive powder, a solvent and 5 to 50 percent by weight of an organic binder comprising one or more monohydric phenol adduct compounds selected from the group consisting of:
   (a) a monohydric phenol adduct of an unsaturated fatty acid, its metal salt or an unsaturated fatty acid ester,
   (b) a saturated or unsaturated fatty acid ester of said phenol adduct (a),
   (c) a sulfonation product of said phenol adduct (a) and
   (d) an amination product of said phenol adduct (a).

2. The composition as claimed in claim 1, which comprises an electrically conductive powder, a solvent, and a mixture of organic binders wherein one of the binders is one or more monohydric phenol adduct compounds.

3. The composition as claimed in claim 1, in which the monohydric phenol adduct compound is defined by the formula (I):

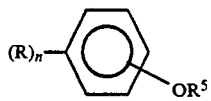

wherein R is a residue of an unsaturated fatty acid or its ester bonded to phenol at the o- or p-position and represented by the formula $R^1COOR^2$— or $R^3OCOR^4$— wherein $R^1$ is a monovalent unsaturated hydrocarbon group having 15 to 21 carbon atoms, $R^2$ is a hydroxyalkylene group having at least one carbon atom, an arylene group or a branched or straight-chain alkylene group, $R^3$ is a hydrogen atom, a hydroxyalkyl group having at least one carbon atom, an aryl group or a branched or straight-chain alkyl group and $R^4$ is a divalent unsaturated hydrocarbon group having 15 to 21 carbon atoms; $R^5$ is hydrogen, an alkali metal, an alkaline earth metal, or a fatty acid residue having 1 to 21 carbon atoms; and n is an integer of 1, 2 or 3.

4. The composition as claimed in claim 1, which comprises 50 to 95 percent by weight, based on the entire composition except for the solvent, of an electrically conductive powder selected from a metal powder and a solid powder coated with a metal, a solvent, 5 to 50 percent by weight, based on the entire composition except for the solvent, of a thermoplastic resin organic binder (B) and one or more monohydric phenol adduct compound (A) at a weight ratio of (A) to (B) in the range between 0.1/99.9 and 99.9/0.1.

5. The composition as claimed in claim 1, which further comprises at least one of a fatty acid, a fatty acid metal salt, a higher aliphatic amine and a reducing agent.

6. The composition as claimed in claim 1, which comprises 50 to 95 percent by weight, based on the entire composition except for the solvent, of an electrically conductive powder selected from a metal powder and a solid powder coated with a metal, a solvent, 5 to 40 percent by weight, based on the entire composition except for the solvent, of a thermoplastic resin organic binder (B) and one or more monohydric phenol adduct compound (A) at a weight ratio of (A) to (B) in the range between 0.5/99.5 and 90/10.

7. An electric article containing a printed electric circuit which comprises a base and the paste composition as defined in claim 1 cured on the base.

* * * * *